United States Patent [19]

Sachtschale et al.

[11] Patent Number: 5,360,092
[45] Date of Patent: Nov. 1, 1994

[54] FIXTURE FOR POSITIONING ELECTRICAL COMPONENTS

[75] Inventors: Timothy G. Sachtschale, Vista; Steven P. Barry, San Diego, both of Calif.

[73] Assignee: Scientific-Atlanta, Inc., Atlanta, Ga.

[21] Appl. No.: 992,336

[22] Filed: Dec. 17, 1992

[51] Int. Cl.[5] .............................................. B65G 11/18
[52] U.S. Cl. .............................. 193/2 R; 193/25 FT; 193/1
[58] Field of Search ............... 193/2; 198/468.8, 463.4, 198/345.1, 530

[56] References Cited

U.S. PATENT DOCUMENTS

| | | | |
|---|---|---|---|
| 2,180,163 | 11/1939 | Milmoe et al. | 198/468.8 X |
| 2,724,484 | 11/1955 | McCoy | 198/468.8 X |
| 3,311,215 | 3/1967 | Clark et al. | 198/468.8 X |
| 4,314,628 | 2/1982 | Calbert et al. | 193/2 R |
| 4,718,531 | 1/1988 | Bianchi et al. | 198/2 R X |
| 4,813,573 | 3/1989 | Anderson | 198/463.4 X |
| 4,977,993 | 12/1990 | Chapman | 193/45 |
| 5,048,664 | 9/1991 | Jackson et al. | 198/345.1 X |
| 5,070,988 | 12/1991 | Konishi et al. | 193/2 B X |
| 5,152,390 | 10/1992 | Kubota et al. | 198/463.4 |

OTHER PUBLICATIONS

Article entitled, "New Product Release", Dec. 1992, US-Vibra, Arizona Gear and Manufacturing Co., (6 pages).

*Primary Examiner*—D. Glenn Dayoan
*Attorney, Agent, or Firm*—Skjerven, Morrill, MacPherson, Franklin & Friel

[57] ABSTRACT

A method for positioning an electrical component for pick-up by a pick-and-place device which includes removing the electrical component directly from a storage tube through a window formed in the storage tube. The electrical components slide in the storage tube to a desired removal position which is adjacent the window, and are removed through the window using a pick-up tool. A modified storage tube formed with the window is also disclosed, along with a connecting hole with which the storage tube is connected to a fixture. The fixture includes a pin which fits into the connecting hole.

9 Claims, 10 Drawing Sheets

FIXTURE FOR POSITIONING ELECTRICAL COMPONENTS

BACKGROUND OF THE INVENTION

1. Field of the Invention

The present invention relates generally to pick-and-place devices for picking up electrical components from source locations and placing them onto printed circuit boards (PCBs), and more particularly to a method and apparatus for positioning the electrical components for pick-up by a pick-and-place device.

2. Description of the Prior Art

Pick-and-place devices are used in automated PCB assembly to pick up particular electrical components known as surface mount devices (hereafter "SMDs") from source locations and to place the SMDs on a PCB in predetermined mounting locations.

An SMD is an electrical component having a molded body and a plurality of fixed leads extending from the molded body. An integrated circuit is typically mounted in the molded body, and electrical signals are transmitted to and from the integrated circuit through the fixed leads. The fixed leads are typically connected to an exterior circuit mounted on a PCB. A commonly-recognized SMD is a dual-in-line package ("DIP") which has two rows of fixed leads disposed on two parallel sides of the molded body. In another SMD design, several rows of fixed leads extend from a lower surface of the molded body. Although the number and location of leads and the size of the molded body varies, all SMDs are similar in that their molded body is formed with a flat upper surface which can be accessed by a pick-and-place device as described below.

Pick-and-place devices typically include a computer-positioned pick-up tool which picks up an SMD from one of a plurality of source locations and places the SMD on a PCB at a predetermined mounting location.

As shown in FIGS. 9 through 11, a typical prior art pick-and-place device 10 includes a first carriage 20 for positioning a pick-up tool 30 in an X-direction, a second carriage 40 for positioning fixtures 50 in a Y-direction, and a third carriage 60 for positioning a PCB 70 in the Y-direction. In addition, a mechanism (not shown) is disposed on first carriage 20 for moving pick-up tool 30 in the Z-direction toward and away from fixture 50 or PCB 70. Connected to fixture 50 are one or more SMD storage tubes 80. SMDs are fed from storage tubes 80 into a pick-up position 51 formed in each fixture 50.

Other embodiments of pick-and-place device 10 can be used. For example, fixtures 50 can be stationary, and first carriage 20 can be disposed to move in the Y-direction, along the row of pick-up positions, as well as the X- and Z-directions.

A pick-and-place operation using pick-and-place device 10 will now be described with the aid of FIGS. 9-11. First, second carriage 40 is moved in the Y-direction until a selected pick-up position 51 of fixture 50 is aligned with the X-direction movement of pick-up tool 30. In addition, third carriage 60 is moved in the Y-direction until a selected mounting location 71 of PCB 70 aligns with the X-direction movement of pick-up tool 30. First carriage 20 is then moved in the X-direction until pick-up tool 30 is disposed over selected pick-up location 51. Pick-up tool 30 is then moved in the Z-direction toward the pick-up location 51. An SMD disposed in the selected pick-up location 51 is then secured to an open end 31 (FIG. 11) of pick-up tool 30 by moving open end 31 to contact the flat upper surface of the SMD, and then generating a partial vacuum in the pick-up tool 30 such that the SMD is forced against open end 31 of the pick-up tool 30 by suction. The SMD is then lifted from the selected pick-up location 51 by the Z-direction movement of pick-up tool 30. First carriage 20 then moves in the X-direction to position pick-up tool 30 over selected mounting location 71. Pick-up tool 30 is then moved in the Z-direction until the SMD is placed in selected mounting position 71. Finally, the partial vacuum in pick-up tool 30 is terminated, thereby releasing the SMD from pick-up tool 30.

During the pick-and-place operation, a successful SMD pick-up is determined by sensing the partial vacuum in pick-up tool 30, which indicates that an SMD is blocking open end 31. That is, if an SMD is not picked-up, then a vacuum cannot be maintained in pick-up tool 30. When it is determined that an SMD was not picked-up, pick-up tool 30 typically moves to pre-programmed alternate pick-up location from which a desired SMD can be obtained. When no vacuum is detected for any of the alternate pick-up locations, the pick-and-place operation is terminated until the SMDs are manually supplied to the pick-up locations and a reset signal is activated.

As mentioned above, SMDs are positioned for pick-up using fixtures 50 into which SMDs are fed from storage tubes 80.

As shown in FIGS. 12 to 14, a typical prior art fixture 50 is precision-machined from an aluminum block. Fixture 50 includes a base 52 defining one or more nests 53 bounded by side walls 54. Nests 53 extend from a first end 55 of base 52 to a front wall 56. The width and length of nests 53 are determined by the size of the SMD to be positioned for pick-up. Pick-up location 51 is located in nest 53 adjacent front wall 56. Also formed on base 52 is a hole 57 which is used to connect base 52 to second carriage 40. Finally, a storage tube receiving lip 59 is formed in nest 53 adjacent first end 55. Lip 59 is used for receiving an end of a storage tube.

As shown in FIGS. 15 to 17, prior art SMD storage tube 80 typically includes a bottom wall 81, side walls 82 and an upper wall 83. As shown in FIG. 17, a longitudinal axis L is defined by a length of the storage tube 80. A passage 84 is defined within storage tube 80 by bottom wall 81, side walls 82 and upper wall 83. SMDs 90 are confined to slide in passage 84 along longitudinal axis L. Typically, a clearance is formed within storage tube 80 such that SMDs 90 can move slightly from side to side and in a vertical direction in passage 84.

As shown in FIG. 16A and 16B, bottom wall 81 of storage tube 80 can either be flat or can include a centering ridge 85. Ridge 85 is disposed on bottom wall 81 along the longitudinal axis L. SMDs 90 disposed in storage tube 80 straddle ridge 85 such that the SMDs are centered in passage 84. Ridge structures, other than the "W-shaped" structure of FIG. 16B, can also be used for the purpose of centering SMDs 90.

As shown in FIG. 17, SMDs 90 are typically aligned in storage tube 80 such that they abut each other along longitudinal axis L. A first end 86 and a second end 87 of storage tube 80 are typically covered or blocked during shipping such that the SMDs 90 do not slide out of storage tube 80 through first end 86 or second end 87.

As shown in FIG. 18A, the prior art method of positioning SMDs for pick-up by pick-up tool 30 includes connecting storage tube 80 to a fixture 50 such that SMDs 90 slide from storage tube 80 into nest 53. Storage tube 80 is supported in an inclined position such that end 86 of storage tube 80 rests against lip 59 of fixture 50. Lip 59 is typically sized such that SMDs 90 slide smoothly from bottom wall 81 into nest 53. A vibrating mechanism (not shown) is typically located between the second carriage 40 and the fixture 50 to shake the SMDs from thee storage tube 80 into nest 53.

Also shown in FIG. 18A is an SMD 90 correctly located in nest 53 at pick-up location 51. During normal operation, when SMDs are caused to slide into nest 53 from storage tube 80, lead SMD 90 is pushed by the remaining SMDs 90' into pick-up location 51. When properly located in pick-up location 51, an upper surface 91 of SMD 90 is positioned parallel to a lower surface of nest 53. In this position, SMD 90 can be picked up by pick-up tool 30.

There are several disadvantages associated with the prior art positioning method, described above.

First, the prior art method is expensive to implement because each fixture 50 is precision-machined from aluminum blocks. Precision machining is expensive because it requires expensive machine tools and substantial amounts of skilled labor.

Second, each fixture 50 can only be used for SMDs of a single size. Because SMDs having numerous sizes are typically mounted onto a single PCB, numerous fixtures 50 must be produced to position all of the SMDs for pick-up.

As shown in FIG. 18B, a third disadvantage occurs because the SMDs slide from passage 84 to nest 53. This requires each SMD to slide from one surface, inside storage tube 80, to a second surface, inside nest 53. When storage tube 80 is not fitted properly to fixture 50, a gap is formed between the two surfaces. This gap often causes SMDs to become snagged or trapped, as shown in FIG. 18B.

As shown in FIG. 18C, another problem is caused when SMDs are not smoothly fed into nest 53. Because of the transition between storage tube 80 and nest 53, the forces exerted by adjacent SMDs can become misaligned. These misaligned forces can cause SMD 90 to "piggy-back" onto an adjacent SMD 90', as shown in FIG. 18C.

As shown in FIG. 19, another disadvantage is that prior art fixtures 50 use an excessive amount of space on second carriage 40. As shown, second carriage 40 has a maximum length d along which fixtures 50 can be disposed. When fixtures 50 are disposed on second carriage 40, a portion e of the length d is taken up by a spacing between each pair of fixtures 50. In addition, portions f are taken up by side walls 54 of each fixture 50. Finally, a portion g is taken up by unused nests 53. The cumulative unused space taken up by portions e, f and g greatly reduces the usable portion of length d. This greatly reduces the number of pick-up positions which can be disposed on second carriage 40. Therefore, the number of pick-up positions 51 is not optimized using the prior art method.

SUMMARY OF THE INVENTION

The present invention is directed to an apparatus and a method for economically and reliably positioning SMDs at pick-up locations for use in pick-and-place operations which overcomes the above-described disadvantages of the prior art.

In accordance with the present invention, a method for positioning an SMD for pick-up by a pick-and-place device includes removing the SMD directly from a storage tube through a window formed in the storage tube. Because the SMD is removed directly from the storage tube through the window, the prior art fixtures, which include nests for positioning SMDs, can be replaced with inexpensive fixtures. Therefore, the cost associated with manufacturing the prior art fixtures is avoided. Further, the method greatly increases the amount of carriage space which can be used for positioning SMDs. In addition, the SMDS are reliably positioned for pick-up because the SMDs remain on the bottom wall of the storage tube; that is, there is no transition from a storage tube into a nest, as required in the prior art method.

In one embodiment, the method includes the steps of disposing a pin on a fixture, forming a hole in the storage tube, and connecting the storage tube to the fixture using the pin. The pin obstructs the SMD as it slides in the storage tube such that the SMD is stopped in a desired removal position. Therefore, the pin acts both to connect the storage tube to the fixture and to position the SMD.

A fixture incorporating features of the present invention which is used for positioning an SMD for removal from an elongated storage tube includes a body and means for removably connecting an elongated storage tube to the body such that SMDs disposed adjacent a window formed in the storage tube abut, or rest against, the connecting means in a desired removal position. In one embodiment, the base is a flat metal plate and the connecting means includes a pin disposed on the fixture which fits into an opening formed in the storage tube, thereby connecting the storage tube to the fixture. The pin can either be removably or fixedly connected to the fixture.

A storage tube incorporating the features of the present invention includes a window formed in the storage tube such that SMDs can be removed through the window. In one embodiment a hole or other connecting means is formed near the end of the storage tube.

A method for modifying a prior art storage tube in accordance with the present invention includes forming a window in the storage tube such that SMDs can be removed through the window in a direction other than along a longitudinal axis of the storage tube. In one embodiment, the method includes removing a portion of an upper wall of the storage tube. In another embodiment, the window is formed adjacent an end of the storage tube.

BRIEF DESCRIPTION OF THE DRAWINGS

These and other features, aspects, and advantages of the present invention will become better understood with regard to the following description, appended claims, and accompanying drawings, where:

DETAILED DESCRIPTION OF THE INVENTION

Figure 1:
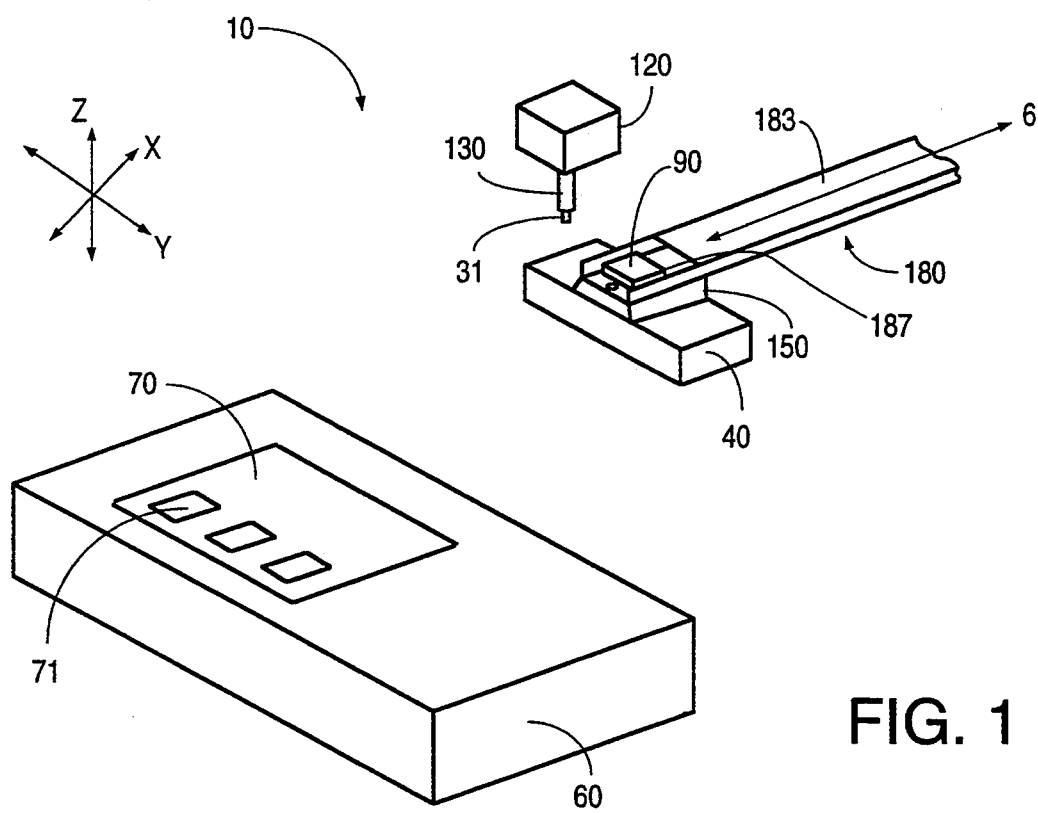
FIG. 1 shows a perspective view of a pick-and-place device embodying the present invention.

As shown in FIG. 1, in accordance with the present invention, a method for positioning an SMD 90 (electrical component) for pick-up by a pick-and-place device 10 includes removing SMD 90 directly from a novel or modified storage tube 180. As shown, SMD 90 is confined to slide in storage tube 180 along longitudinal axis L. A window (opening) 187 is formed in an upper wall 183 of storage tube 180 through which SMD 90 is removed by pick-up tool 30 in a direction other than along longitudinal axis L. Storage tube 180 is positioned relative to pick-and-place device 10 such that SMD 90 is in a desired pick-up position when SMD is located adjacent window 187.

In a preferred embodiment, the positioning method is accomplished using novel or modified storage tube 180, and a novel fixture 150 for positioning storage tube 180 and SMD 90 such that SMD 90 is removable through window 187 by pick-up tool 30. Storage tube 180 and fixture 150 are discussed in greater detail immediately below.

Figure 2:
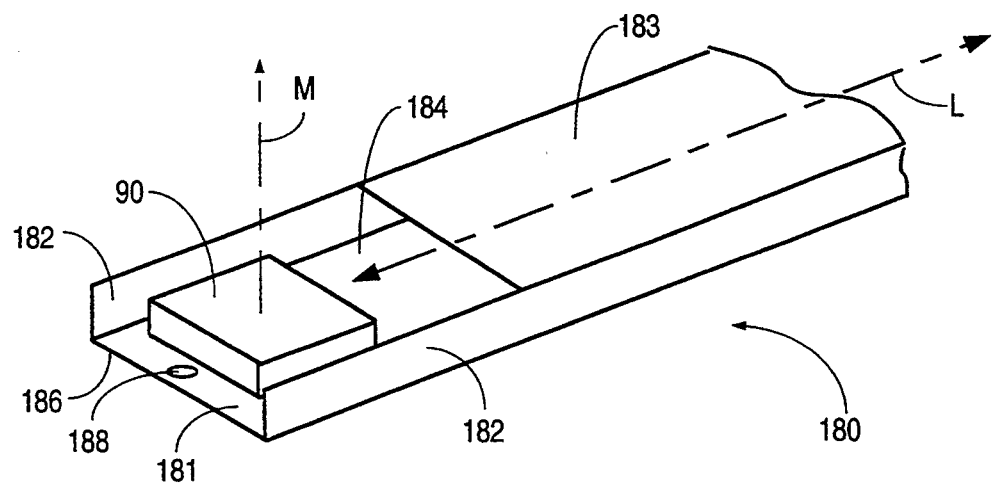
FIG. 2 shows a perspective view of a storage tube embodying the present invention.

As shown in FIG. 2, storage tube 180 includes bottom wall 181 having an inner surface upon which SMDs 90 slide along longitudinal axis L. Bottom wall 181 can either be flat, as shown in FIG. 2, or can have a centering ridge as discussed in Background section, above. Side walls 182 are connected at their lower edges to the side edges of bottom wall 181 and extend parallel to longitudinal axis L. An upper wall 183 is connected to the upper edges of side walls 182. Bottom wall 181, side walls 182 and upper wall 183 cooperatively form a passage 184 in which SMDs 90 are confined to slide along longitudinal axis L. As with the prior art storage tubes, SMDs 90 move slightly from side-to-side and vertically within passage 184. Finally, a window 187 is defined in storage tube 180 through which SMDs 90 are removable in a direction other than along longitudinal axis L. Note that a centering ridge can be formed in the upper wall 183 instead of bottom wall 181; however, because the centering ridge would not be present adjacent the window 187, an SMD 90 can become misaligned in the pick-up position.

As shown in FIG. 2, in a preferred embodiment, window 187 is formed adjacent an end 186 of storage tube 180. Window 187 is defined in upper wall 183 such that SMD 90 may be removed in a direction M, which is perpendicular to longitudinal axis L. In addition, connecting means are formed on storage tube 180 for connecting storage tube 180 to novel fixture 150. As shown in FIG. 2, in a preferred embodiment, a hole 188 is formed adjacent end 186 which is used to connect storage tube 180 to a pin formed on novel fixture 150 (described below).

Figure 3A:
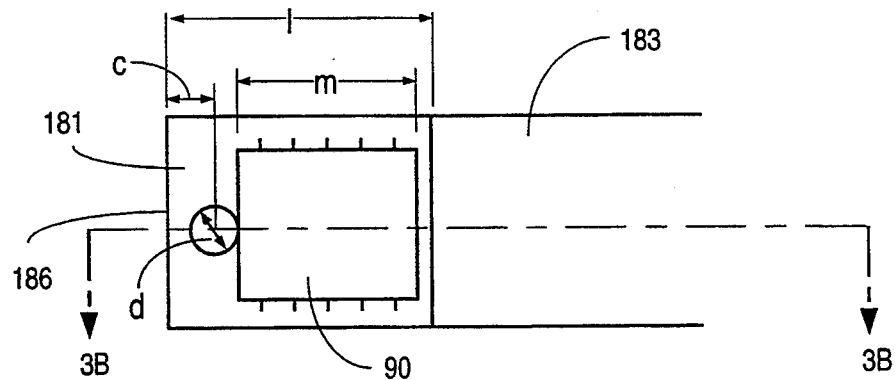
FIGS. 3A and 3B show a top view and a side section view of the storage tube.
Figure 3B:
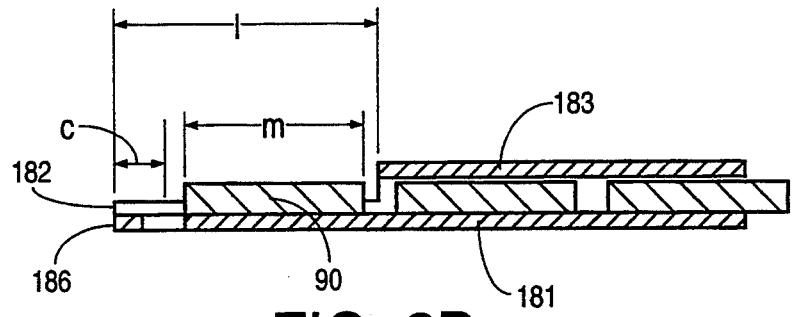

As shown in FIGS. 3A and 3B, the size of window 187 is determined by the size of SMD 90 stored in storage tube 180, and the size and location of hole 188. Hole 188 has a diameter d and is centered at a distance c from end 186 of storage tube 180. A length 1 of window 187, measured along longitudinal axis L, is preferably determined by summing the length m of SMD 90, the diameter d of hole 188, the distance c and an additional clearance distance of approximately 0.050 inches, the additional clearance being included to further prevent interference between the SMD 90 and the upper wall 183 when the SMD 90 is removed from the storage tube 180. For example, if SMD 90 has a length of 1 inch, and hole 188 is 0.125 inches in diameter and centered 0.25 inches from end 186, the length 1 of window 187 would be 1.425 inches.

Also shown in FIG. 3B, a portion of side walls 182 adjacent window 187 is preferably shortened such that the top surface of SMD 90 is above side walls 182. This assures that there are no horizontal portions of storage tube 180 which could impede the vertical movement of SMD 90 as it is lifted through window 187.

Figure 4:
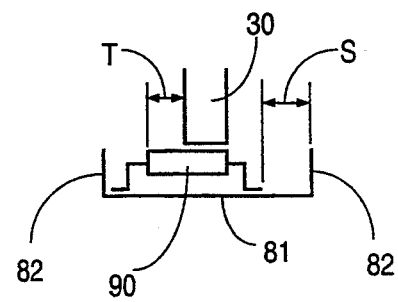
FIG. 4 shows an end section view of the storage tube.

As shown in FIG. 4, in order for storage tube 180 to properly position SMD 90 for pick-up, the side-to-side movement S of SMD 90 in passage 184 must be less than or equal to a distance T, which is the difference in size between a width of SMD 90 and the diameter of pick-up tool 30. If storage tubes which do not meet this requirement are used, then it is possible that pick-up tool 30 will be unable to pick up SMD 90.

A prior art storage tube (described above) is modified in accordance with the present invention by removing a portion of top wall 183 to form window 187. The preferred method for removing a portion of top wall 183 is cutting away the top wall using a knife, saw or milling machine. In addition to forming window 187, the method includes forming a connecting means in bottom wall 181 for connecting storage tube 180 to fixture 150. In a preferred embodiment, the connecting means is formed by drilling hole 188 in bottom wall 181. It is preferred that window 187 be formed prior to drilling hole 188, but these steps may be reversed.

Figure 5A:
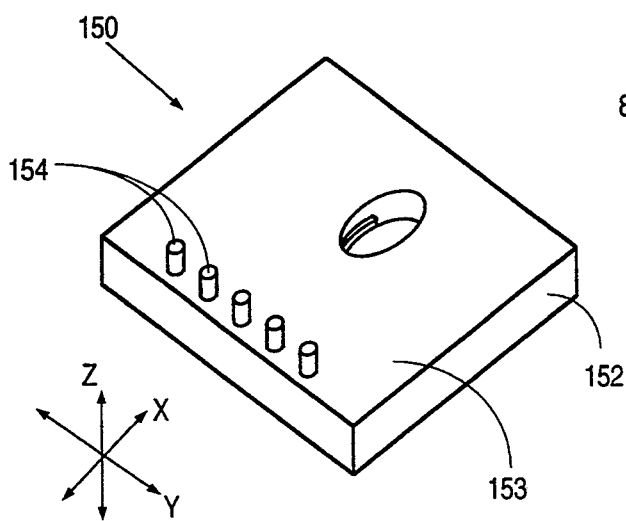
FIGS. 5A and 5B show a perspective view and a side section view of a fixture embodying the present invention.
Figure 5B:
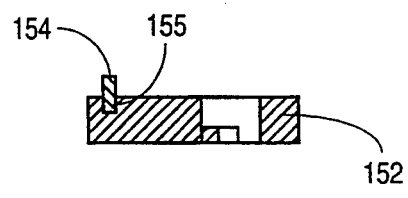

As shown in FIGS. 5A and 5B, fixture 150 preferably comprises a base 152 and means for connecting storage tube 180 to base 152. Fixture 150 also includes means for connecting base 152 to second carriage 40.

Base 152 is preferably formed from a flat aluminum plate approximately 7 inches in length, measured in the Y-direction, 4 inches wide, measured in the X-direction, and ¼ inch thick. The base 152 is not limited to the above-identified preferred length, width and thickness. The dimensions can be changed without substantially effecting the functionality of the base 152.

Figure 6:
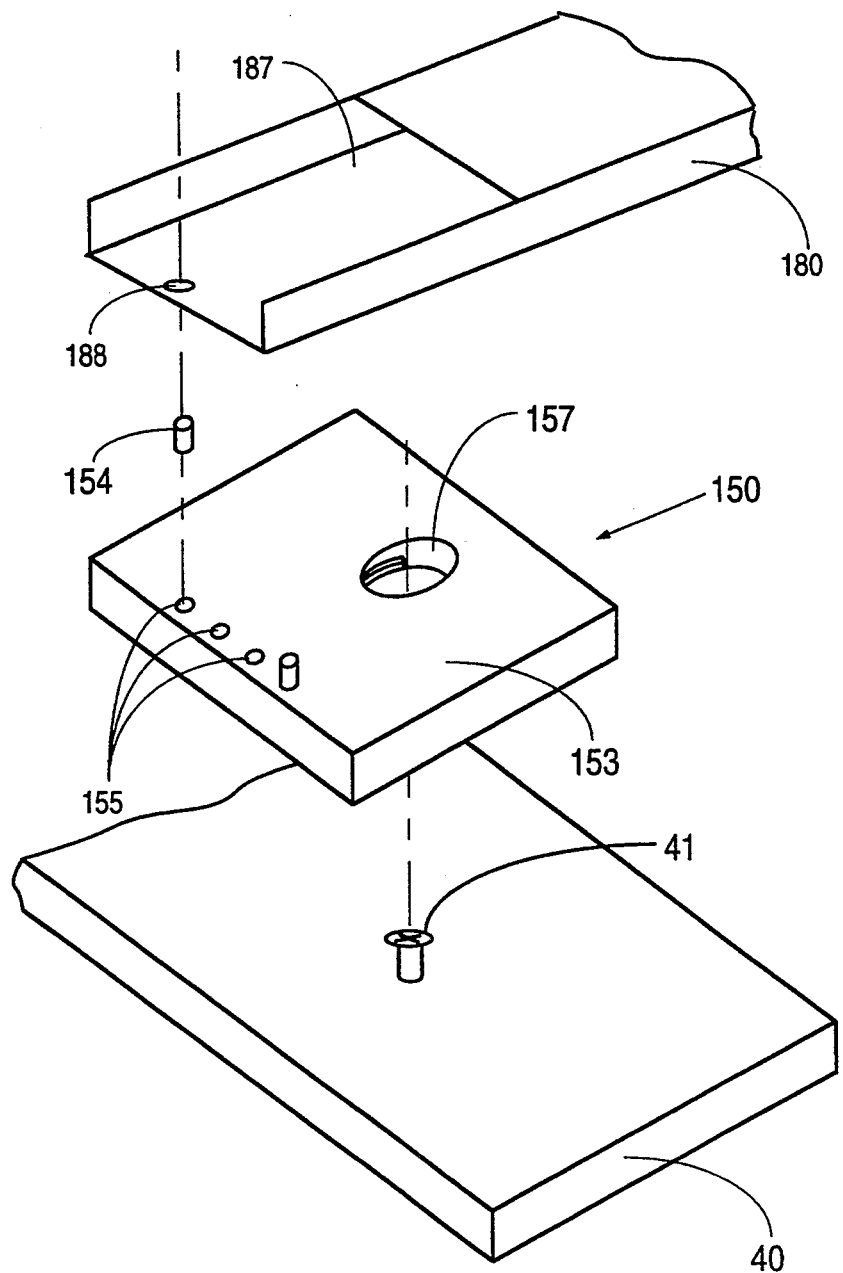
FIG. 6 shows an exploded perspective view of the carriage, fixture and storage tube assembly embodying the present invention.

As shown in FIG. 6, means are formed on fixture 150 for connecting storage tube 180. The connecting means preferably includes pins 154 disposed in bores 155 formed in upper surface 153. The size of holes 188 are determined by the diameter of pins 154. Holes 188 should be large enough to fit over pin 154 without breaking, yet fit tightly over pin 154 such that vibrations applied to fixture 150 are transmitted to storage tube 180. In a preferred embodiment, the diameter of hole 188 is approximately 2 mils smaller than the diameter of pin 154 to generate a slight interferrence fit. The spacing of pins 154 is determined by a width of storage tubes 180 which is to be disposed on the fixture. Pins 154 have a length selected such that they extend above an upper surface 153 base 152. Pins 154 are preferably press-fitted into bores 155; however, pins 154 could be formed with threads such that they are removably screwed into bores 155. In addition, pins 154 can be connected to plate 150 using other connection means such as magnets, glue or fasteners.

Means for mounting base 150 onto second carriage 40 are provided to secure base 150 in a predetermined position relative to pick-and-place device 10. As shown in FIG. 6, in a preferred embodiment, the means for mounting preferably includes a slot 157 through which a bolt or screw 41 can be inserted to secure base 150 to second carriage 40.

Figure 7A:
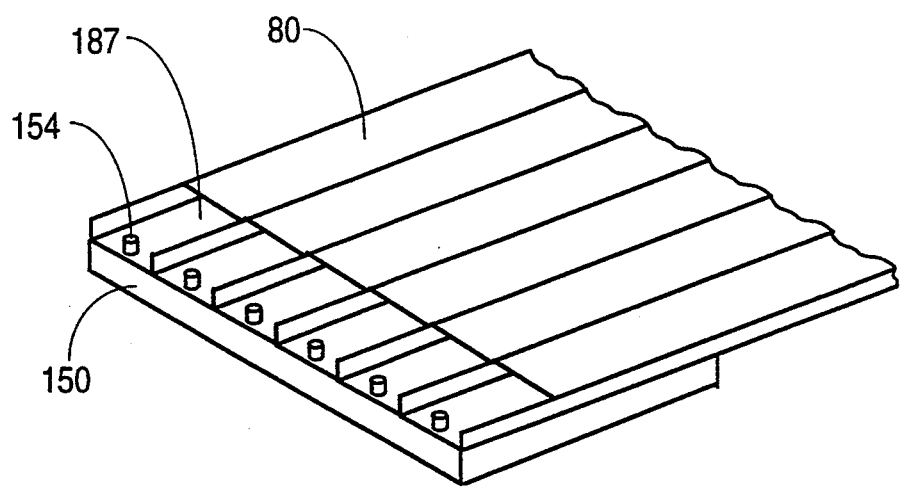
FIGS. 7A and 7B show a perspective view and a front end view of a plurality of storage tubes disposed on the fixture.
Figure 7B:
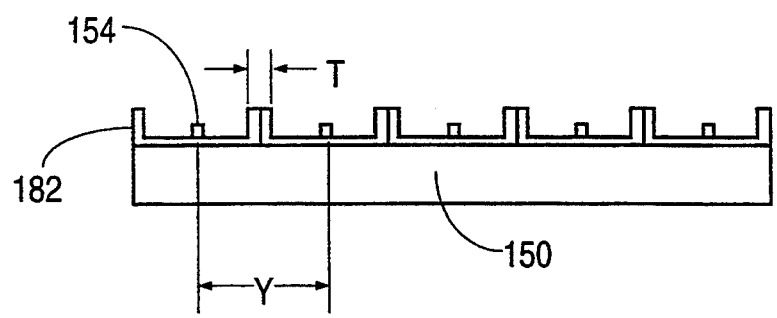

As shown in FIGS. 7A and 7B, storage tubes 180 are mounted on fixture 150 such that they are separated only by the thickness T of side walls 182. This maximizes the number of SMDs disposed for pick-up by pick-up tool 30. However, the side walls 182 of adjacent tubes 180 need not abut in order to realize a reduction in unused space over the prior art. Further, in an embodiment where pins 154 are press-fitted into base 152 at a spacing Y, storage tubes of a width up to 2 times Y can be disposed on the fixture 150. In addition, if threaded bores 155 are disposed on based 152 into which pins 154 can be removably screwed, pins 154 can be selectively spaced such that several sizes of storage tubes 180 can be positioned on a fixture 150 with minimal unused space.

Figure 8:
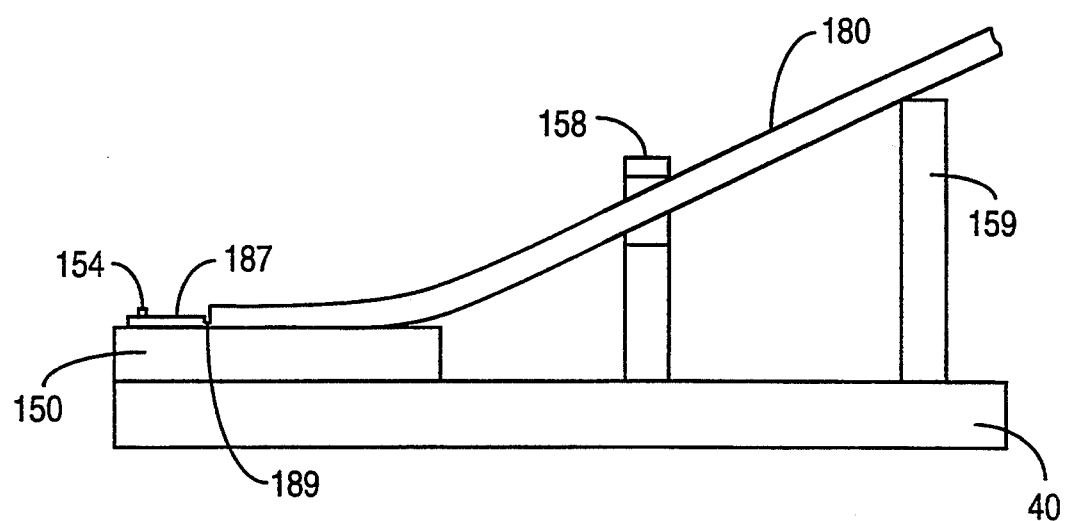
FIG. 8 shows a side view of the fixture and means for holding the storage tube in an inclined position.
Figure 9:
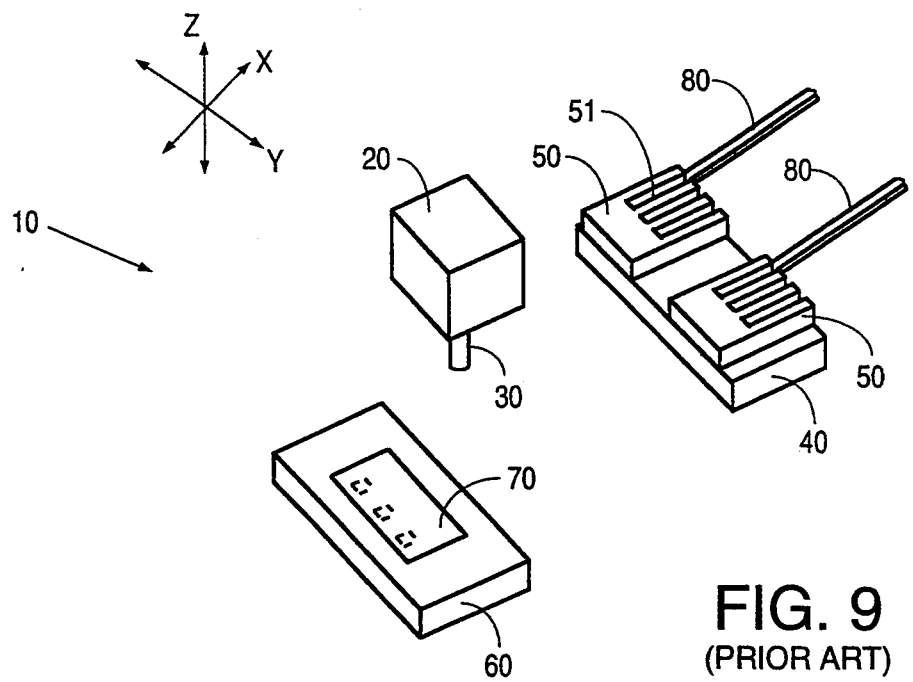
FIG. 9 shows a perspective view of a prior art pick-and-place device.
Figure 10:
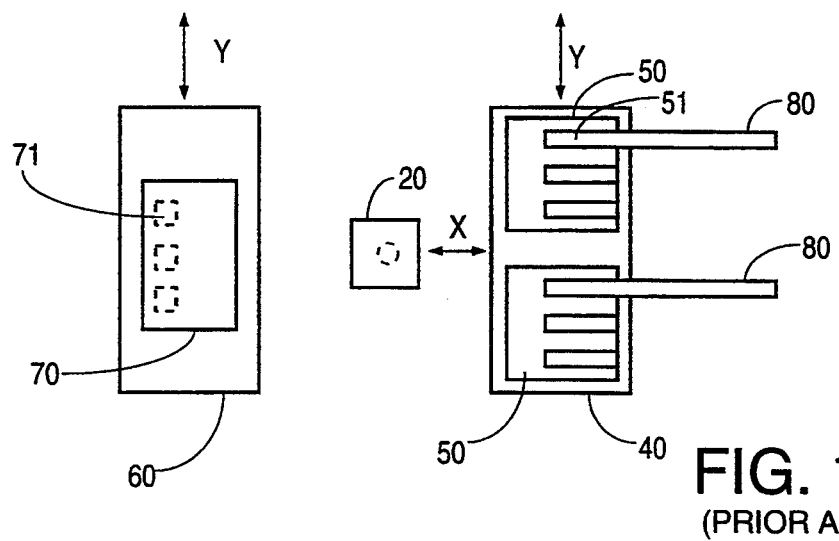
FIG. 10 shows a top view of the prior art pick-and-place device.
Figure 11:
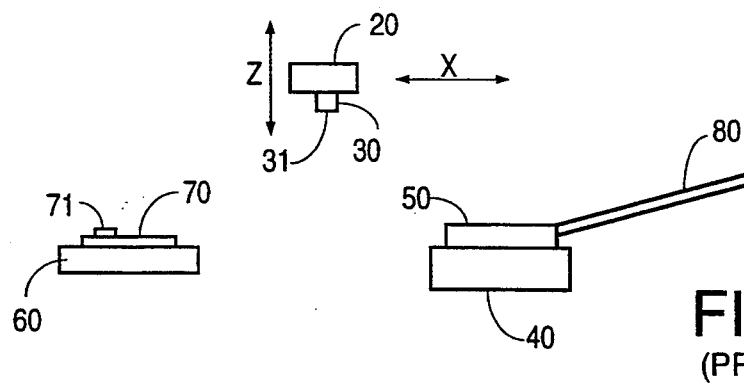
FIG. 11 shows a side view of the prior art pick-and-place device.
Figure 12:
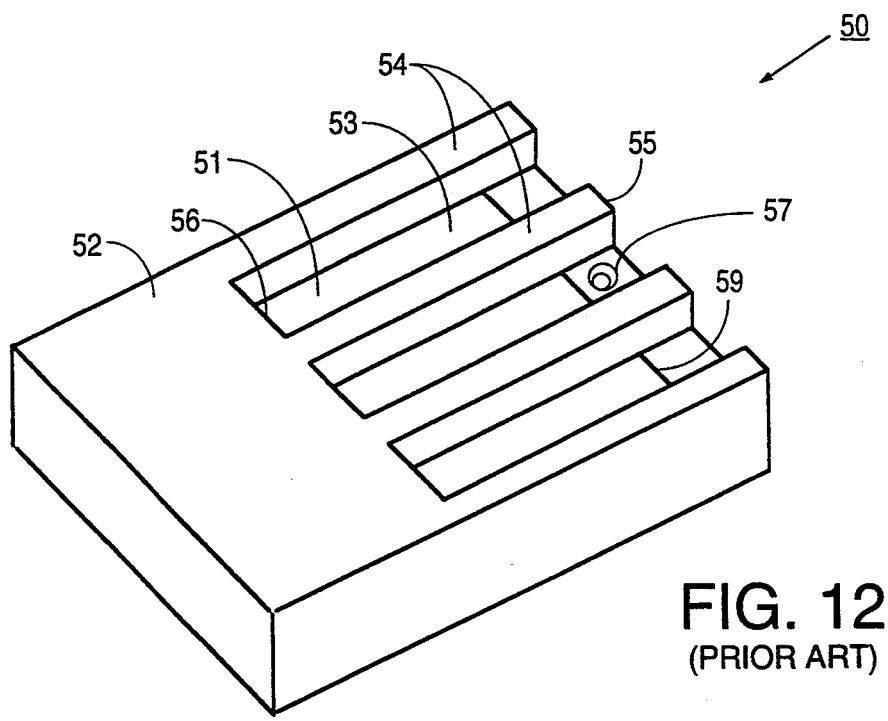
FIG. 12 shows perspective view of a prior art fixture.
Figure 13:
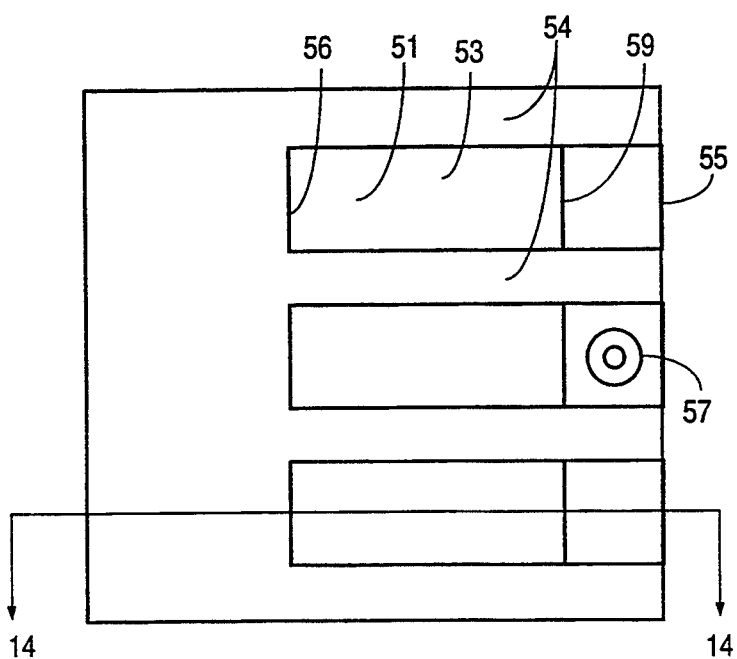
FIG. 13 shows a top view of the prior art fixture.
Figure 14:
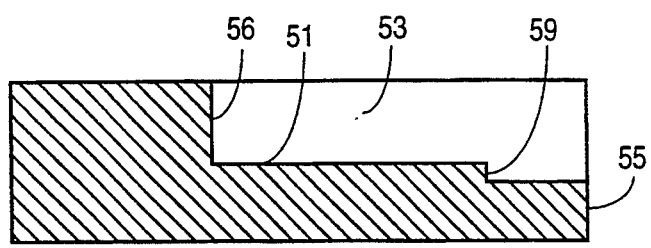
FIG. 14 shows a side section view of a prior art fixture taken along line 14—14 of FIG. 13.
Figure 15:
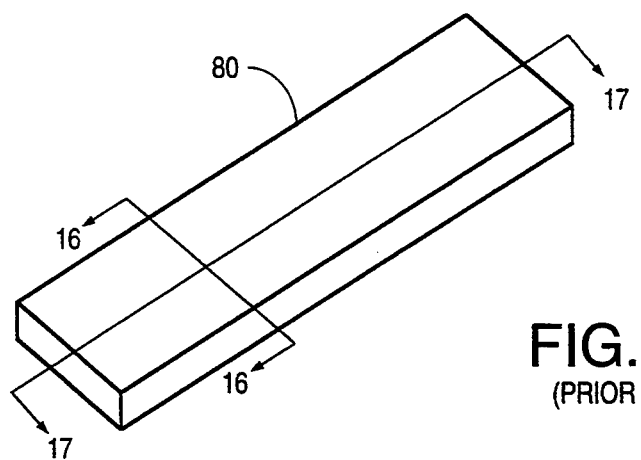
FIG. 15 shows a perspective view of a prior art storage tube.
Figure 16A:
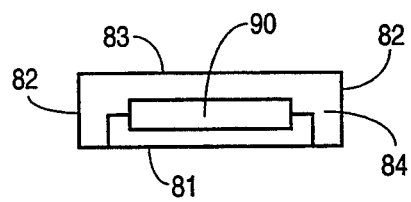
FIGS. 16A and 16B show end section views of the storage tube taken along line 16—16 of FIG. 15.
Figure 16B:
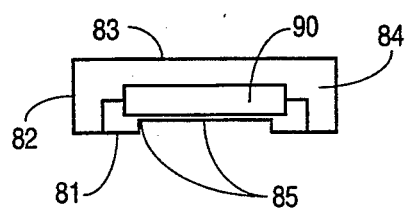
Figure 17:
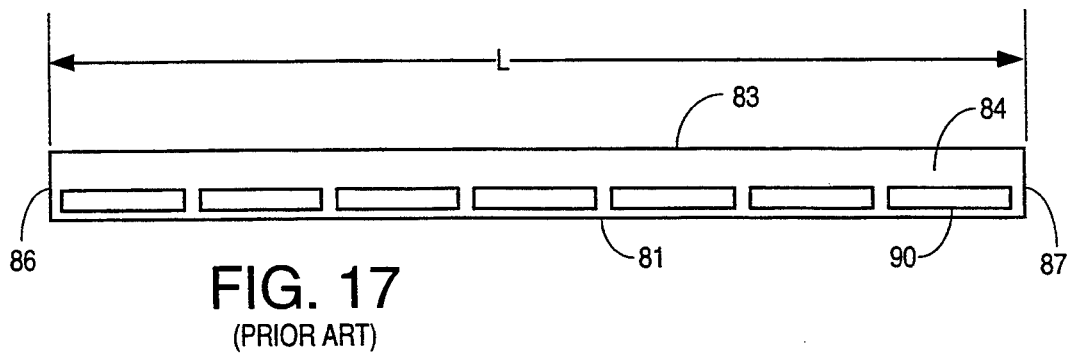
FIG. 17 shows a side section view of the storage tube taken along line 17—17 of FIG. 15.
Figure 18A:
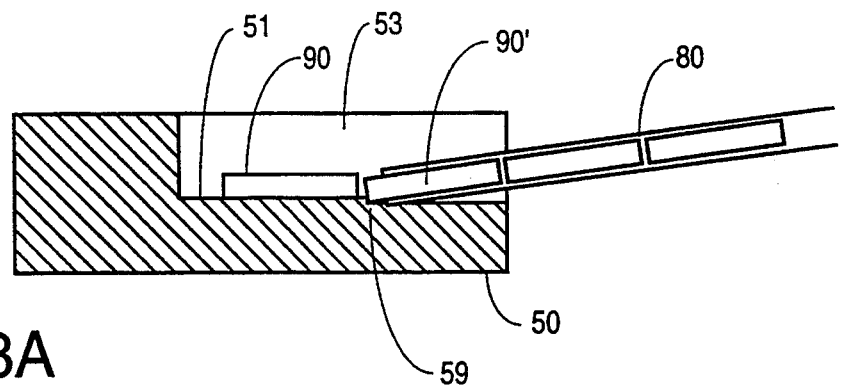
FIGS. 18A, 18B and 18C show side section views of the storage tube connected to the fixture.
Figure 18B:
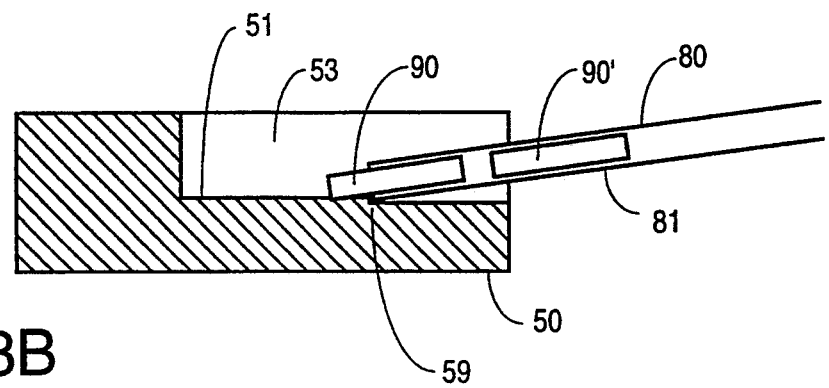
Figure 18C:
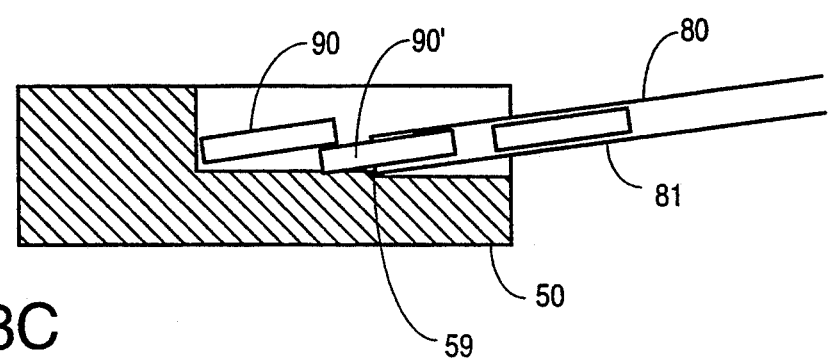
Figure 19:
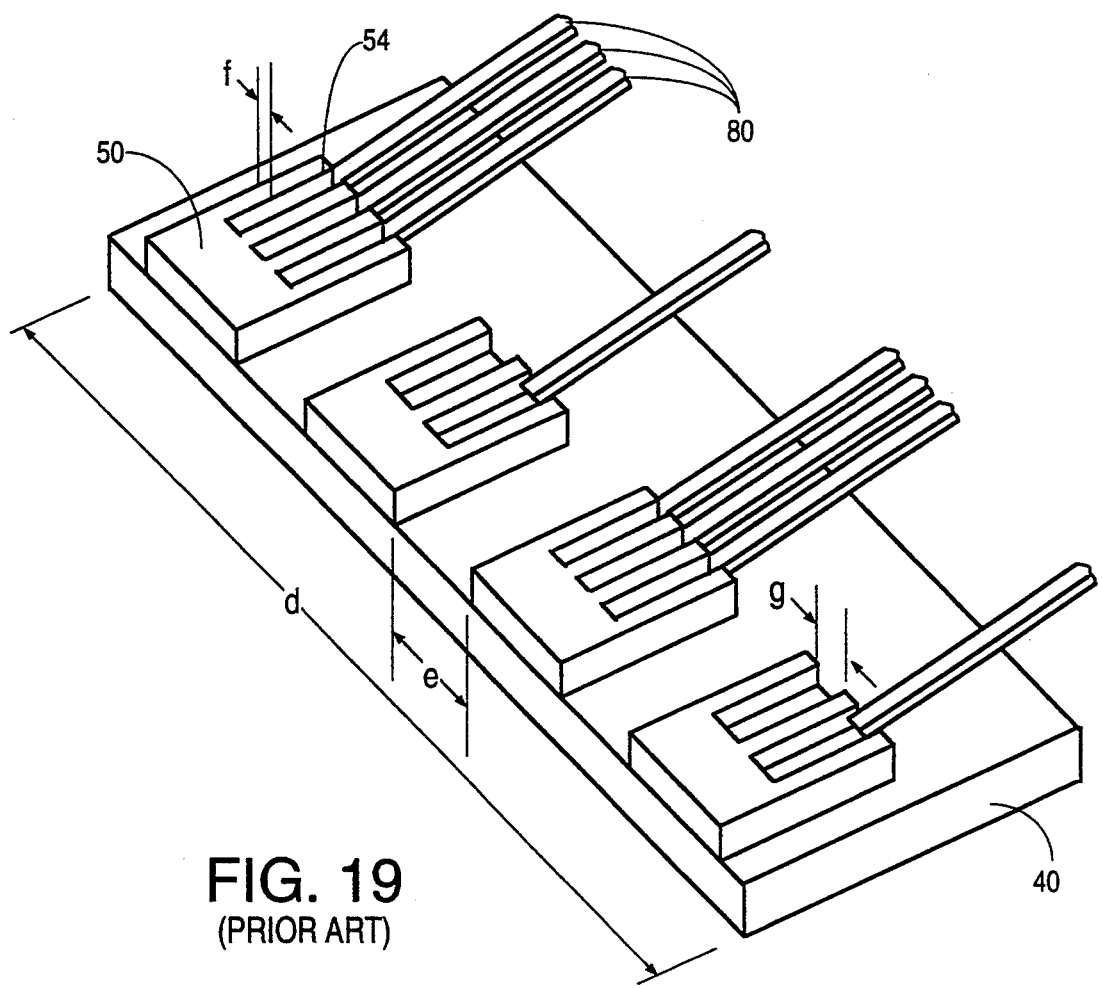
FIG. 19 shows a perspective view of the prior art storage tube and fixture assembly.

In addition, means are provided on second carriage 40 for holding storage tube 180 in an inclined position such that SMDs 180 slide toward window 187. In a preferred embodiment, as shown in FIG. 8, storage tube 180 is secured using a brace 158 and a post 159. In this embodiment, brace 158 cooperates with post 159 to hold storage tube 180 in a slightly bent, inclined position such that a portion of storage tube 180 adjacent window 187 lies flat on fixture 150. Other holding means are possible, such as a sleeve in which storage tube 180 is disposed in the bent, inclined position. In addition, a small strain-relief notch 189 is formed in storage tube 180 as shown in FIG. 8 to cause the portion of bottom wall 181 adjacent window 187 to lay flat on plate 150.

Using the fixture 150 and storage tube 180, described above, the preferred method for positioning SMDs for pick-up by a pick-and-place device includes connecting storage tube 180 to fixture 150 by inserting pin 154 into hole 188 such that a lower surface of storage tube 180 rests against an upper surface of fixture 150. As in the prior art, storage tube 180 is inclined such that SMDs 90 slide along the inner surface of tube 184 toward window 187. SMDs 90 are restrained from sliding out end 186 of storage tube 180 by abutting pin 154. In the position that SMDs 90 abut pin 154, SMDs 90 are disposed in a desired pick-up position such that they can be removed directly from storage tube 180 by pick-up tool 30. Further, in accordance with the presently preferred embodiment, a vibrating mechanism is connected to second carriage 40 to facilitate smooth and reliable sliding of SMDs 90 toward window 187.

An advantage of the present method over the prior art positioning method is that fixtures 150 are inexpensive to produce. Fixture 150 includes pins 154 which are disposed in base 152, for example, by drilling and press-fitting, whereas the prior art fixtures are precision machined to provide a nest into which SMDs are deposited from a storage tube.

Another advantage of the present method is that a single fixture 150 can be used for SMDs of several sizes. Pins 154 can be spaced on base 152 to receive storage tubes 180 having a width equal to or less than a maximum width defined by the spacing of pins 154. Further, base 152 can be provided with a plurality of threaded bores 155 into which pins 154 can be located, thereby allowing storage tubes 180 having differing widths to be disposed on one fixture 150.

Another advantage of the present method is that SMDs 90 remain on the inner surface of storage tube 180, instead of sliding from a storage tube into a nest, as required in the prior art. By sliding only within storage tube 180, the present method prevents SMDs from becoming trapped in storage tube 180, and also prevents the occurrence of "piggy-backing" of one SMD onto another at the pick-up location.

Another advantage of the present method is that storage tubes 180 can be closely spaced on fixtures 150, thereby maximizing the number of pick-up positions accessed by pick-up tool 30.

Although the present invention has been described in considerable detail with reference to certain preferred versions thereof, other versions are possible. For example, a wall can be formed on fixture 150 against which storage tubes 180 are pressed, thereby eliminating the need for pins 154. Therefore, the spirit and scope of the appended claims should not be limited to the description of the preferred versions contained therein.

We claim:

1. A fixture for positioning an electrical component for removal from a storage tube, the storage tube having a longitudinal axis and including a passage, the electrical component being confined to slide in the storage tube along the longitudinal axis, the storage tube defining a window through which the electrical component is removable in a direction other than along the longitudinal axis, the fixture comprising:

a body; and means, disposed on the body, for connecting the storage tube such that when the electrical component is disposed adjacent the window, the electrical component is located in a desired removal position;

wherein the means for connecting comprises a pin connected to the body, the pin being sized to fit within a hole formed in the storage tube, thereby connecting the storage tube to the body.

2. A fixture according to claim 1 wherein the body is a flat plate.

3. A fixture according to claim 1 wherein the connecting means comprises an opening formed in the base, and wherein the pin is fixedly received in the opening.

4. A fixture according to claim 3 wherein the pin is removably connected to the body.

5. A fixture according to claim 3 wherein the pin is fixedly connected to the body.

6. A fixture according to claim 4 wherein the electrical component abuts the pin in the desired removal position.

7. A fixture according to claim 1 wherein the fixture further includes second means, disposed on the body, for connecting the fixture to a carriage.

8. A fixture according to claim 7 wherein the second means for connecting is a slot formed in the body.

9. A fixture according to claim 1 wherein the connecting means comprises an opening formed in the base, and wherein the pin is removably received in the opening.

* * * * *